US012766841B2

(12) United States Patent
Ishizuka et al.

(10) Patent No.: US 12,766,841 B2
(45) Date of Patent: Oct. 20, 2026

(54) LIQUID EJECTION HEAD, AND METHOD FOR PRODUCING LIQUID EJECTION HEAD

(71) Applicant: CANON KABUSHIKI KAISHA, Tokyo (JP)

(72) Inventors: Kazunari Ishizuka, Shizuoka (JP); Satoshi Tsutsui, Kanagawa (JP); Yohei Hamade, Tokyo (JP); Miho Ishii, Kanagawa (JP); Haruka Yamaji, Tokyo (JP); Hikaru Sugimoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 843 days.

(21) Appl. No.: 18/047,054

(22) Filed: Oct. 17, 2022

(65) Prior Publication Data

US 2023/0121773 A1 Apr. 20, 2023

(30) Foreign Application Priority Data

Oct. 18, 2021 (JP) ................................. 2021-170251

(51) Int. Cl.

| | |
|---|---|
| ***B41J 2/16*** | (2006.01) |
| ***G03F 7/038*** | (2006.01) |
| ***G03F 7/16*** | (2006.01) |
| ***G03F 7/20*** | (2006.01) |
| ***G03F 7/32*** | (2006.01) |

(52) U.S. Cl.

CPC ........... *B41J 2/1631* (2013.01); *B41J 2/1645* (2013.01); *G03F 7/0382* (2013.01); *G03F 7/0387* (2013.01); *G03F 7/162* (2013.01); *G03F 7/2018* (2013.01); *G03F 7/32* (2013.01)

(58) Field of Classification Search

None

See application file for complete search history.

(56) References Cited

U.S. PATENT DOCUMENTS

2016/0375687 A1* 12/2016 Watanabe ............ B41J 2/14145 438/21
2018/0201018 A1* 7/2018 Mihara .................. B41J 2/1628
(Continued)

FOREIGN PATENT DOCUMENTS

JP H06286149 A 10/1994
JP H11348290 A 12/1999
JP 2002302537 A * 10/2002
(Continued)

OTHER PUBLICATIONS

Translated Description of Honda (Year: 2016).*
(Continued)

*Primary Examiner* — Sally A Merkling
*Assistant Examiner* — Andrew Preston Traywick
(74) *Attorney, Agent, or Firm* — Canon.U.S.A., .Inc. IP Division

(57) ABSTRACT

A liquid ejection head includes a substrate having a liquid feeding port and an energy generating element, a substrate protective layer provided on the substrate, and a nozzle forming member provided on the substrate protective layer, and having an ejection port ejecting a liquid, and a liquid flow channel communicating with the liquid feeding port and the ejection port. The substrate protective layer comprises an ion scavenger.

19 Claims, 2 Drawing Sheets

(56) References Cited

U.S. PATENT DOCUMENTS

2019/0163064 A1* 5/2019 Ohashi ............... C08G 18/4063
2020/0290358 A1* 9/2020 Yokokawa ............... B01J 41/00

FOREIGN PATENT DOCUMENTS

JP 2006056233 A * 3/2006
JP 2016046300 A * 4/2016
JP 2017193166 A 10/2017

OTHER PUBLICATIONS

Translation of Honda (Year: 2016).*
Translation of Masahiro (Year: 2002).*
Translation of Suzuki (Year: 2006).*

* cited by examiner

LIQUID EJECTION HEAD, AND METHOD FOR PRODUCING LIQUID EJECTION HEAD

BACKGROUND OF THE INVENTION

Field of the Invention

The present disclosure relates to a liquid ejection head, and to a method for producing a liquid ejection head.

Description of the Related Art

Examples of the use of liquid ejection heads that eject a liquid include inkjet recording schemes in which ink is ejected onto a medium to be recorded on. Inkjet heads that are used in inkjet recording schemes (liquid injection recording schemes) are generally provided with small ejection ports, an ink flow channel, and multiple energy generating elements that generate energy used in order to eject a liquid and that are provided in part of the ink flow channel.

Conventional methods for producing such an inkjet recording head include the method disclosed in for instance Japanese Patent Application Publication No. H06-286149. Firstly, a pattern of the ink flow channel is formed using a soluble resin, on a substrate on which energy generating elements are formed. A coating resin layer containing an epoxy resin that yields the ink flow channel and a photocationic polymerization initiator is formed next on the ink flow channel pattern, and ejection ports are formed, over the energy generating elements, by photolithography. Lastly, the soluble resin is eluted, and thereafter the coating resin layer that yields the ink flow channel is cured, to thereby form an ink flow channel forming member.

Herein so-called thermal inkjet heads are known in which heat-generating resistors are used as the energy generating elements, ink is caused to boil to thereby form bubbles and elicit ejection of the ink. In such a head, an inorganic insulating film that uses silicon nitride or silicon dioxide and an anti-cavitation layer that uses Ta or the like are generally provided on the heat-generating resistors, in order to reduce damage to the heat-generating resistors derived from corrosion by the ink or from cavitation at the time of bubble defoaming. The Ta film exhibits very low adhesion to the resin that constitutes the above-described ink flow channel member, and as a result the ink flow channel member may peel off the Ta film.

Herein the Ta film at the portion where the ink flow channel member is provided might conceivably be removed for the purpose of preventing peeling of the ink flow channel member. In this case, the resin that makes up the ink flow channel is laid up, only via the above-described inorganic insulating layer, on electro-thermal conversion bodies (electro-thermal conversion elements) on the substrate. However, the inorganic insulating layer has ordinarily a porous film quality, which allows for permeation of ions contained in the resin, the electro-thermal conversion bodies may be corroded by these permeating ions.

It has therefore been necessary to increase adhesion between the substrate and the ink flow channel member, with a view to preventing the ink flow channel member from peeling off. Examples include an instance where an undercoat layer (adhesion-improving and passivation layer) made up of a polyimide resin is used in the substrate, and an instance where there is used an adhesion layer made up of a polyether amide resin, as described in Japanese Patent Application Publication No. H11-348290.

SUMMARY OF THE INVENTION

However, studies by the inventors have revealed that in a liquid ejection head that uses an undercoat layer or an adhesion layer in a substrate, the electro-thermal conversion bodies are corroded in cases where the liquid ejection head is used in particularly harsh environments, for instance when an acidic ink is used. The technical disadvantage of lower electrical reliability may arise in such cases. This disadvantage was particularly prominent in cases where the undercoat layer or adhesion layer was made up of a polyimide resin or a polyether amide resin. As a result of diligent research conducted by the inventors and aimed at solving the disadvantages described in the background art section above, it was found that corrosion of the electro-thermal conversion bodies can be prevented by providing a substrate protective layer containing an ion scavenger, between the substrate and a nozzle forming member.

The present disclosure, which overcomes the disadvantages above, provides a liquid ejection head that affords high electrical reliability, also with ever more diverse ink types.

The present disclosure relates to a liquid ejection head, comprising: a substrate having a liquid feeding port and an energy generating element; a substrate protective layer provided on the substrate; and a nozzle forming member provided on the substrate protective layer, and having an ejection port for ejecting a liquid, and a liquid flow channel in communication with the liquid feeding port and the ejection port; wherein the substrate protective layer comprises an ion scavenger.

Further, the present disclosure relates to a method for producing a liquid ejection head comprising: a substrate having a liquid feeding port and an energy generating element; a substrate protective layer provided on the substrate; and a nozzle forming member provided on the substrate protective layer, and having an ejection port for ejecting a liquid, and a liquid flow channel in communication with the liquid feeding port and the ejection port, the method comprising the steps of: patterning a resin on the substrate, to form the substrate protective layer; and patterning a negative-type photosensitive resin, on the substrate protective layer, to form a nozzle forming member having an ejection port for ejecting a liquid, and a liquid flow channel in communication with the liquid feeding port and the ejection port, wherein the substrate protective layer comprises an ion scavenger.

The present disclosure succeeds in providing a liquid ejection head in which corrosion of electro-thermal conversion bodies can be suppressed, and which affords high electrical reliability, also with ever more diverse ink types. Further features of the present disclosure will become apparent from the following description of exemplary embodiments with reference to the attached drawings.

DESCRIPTION OF THE EMBODIMENTS

The present disclosure will be described below in specific terms, with reference to accompanying drawings. However, the dimensions, materials, shapes, relative arrangement and so forth of the constituent components described in the embodiments are to be modified as appropriate depending on the configuration of the members to which the disclosure is to be applied, and on various conditions. That is, the scope of the present disclosure is not meant to be limited to the embodiments below.

In the present disclosure, the expression of "from XX to YY" or "XX to YY" indicating a numerical range means a numerical range including a lower limit and an upper limit which are end points, unless otherwise specified. When a numerical range is described in a stepwise manner, the upper and lower limits of each numerical range can be arbitrarily combined.

The present disclosure relates to a liquid ejection head, comprising: a substrate having a liquid feeding port and an energy generating element; a substrate protective layer provided on the substrate; and a nozzle forming member provided on the substrate protective layer, and having an ejection port for ejecting a liquid, and a liquid flow channel in communication with the liquid feeding port and the ejection port; wherein the substrate protective layer comprises an ion scavenger.

Further, the present disclosure relates to a method for producing a liquid ejection head comprising: a substrate having a liquid feeding port and an energy generating element; a substrate protective layer provided on the substrate; and a nozzle forming member provided on the substrate protective layer, and having an ejection port for ejecting a liquid, and a liquid flow channel in communication with the liquid feeding port and the ejection port, the method comprising the steps of: patterning a resin on the substrate, to form the substrate protective layer; and patterning a negative-type photosensitive resin, on the substrate protective layer, to form a nozzle forming member having an ejection port for ejecting a liquid, and a liquid flow channel in communication with the liquid feeding port and the ejection port, wherein the substrate protective layer comprises an ion scavenger.

An instance of an inkjet head will be described next as an example of the uses of the liquid ejection head, but the scope of application of the liquid ejection head is not limited thereto.

Figure 1:
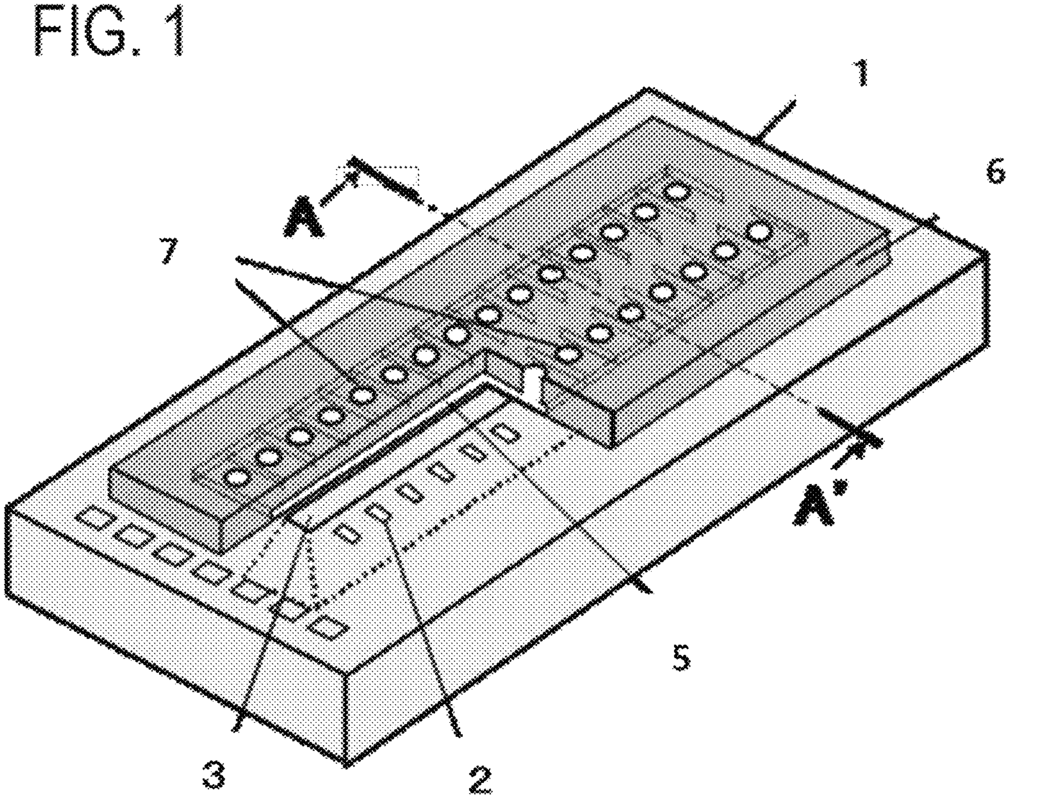
FIG. 1 is a schematic perspective view diagram illustrating a liquid ejection head according to an embodiment of the present disclosure.
Figure 2:
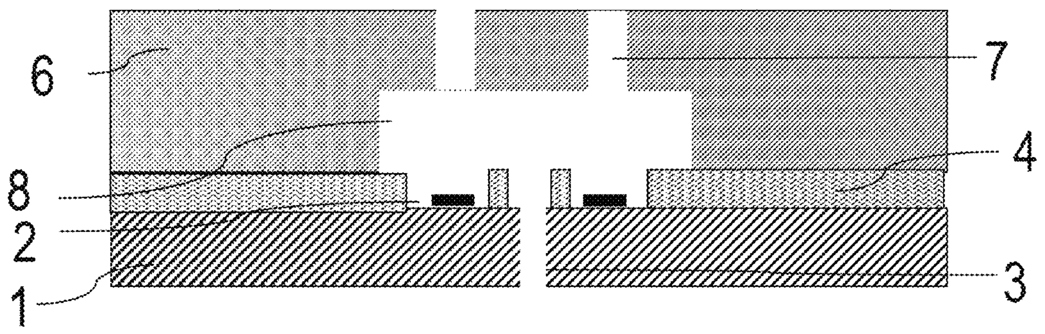
FIG. 2 is an example of a schematic cross-sectional diagram along line A-A' in FIG. 1.

FIG. 1 is a schematic perspective-view diagram illustrating an example of the configuration of a liquid ejection head (inkjet head) according to an embodiment of the present disclosure. Further, FIG. 2 is a schematic cross-sectional view diagram illustrating an example of a liquid ejection head (inkjet head) according to an embodiment of the disclosure, as viewed from a plane perpendicular to a substrate at line A-A' in FIG. 1.

The inkjet head has a Si substrate 1 provided with energy generating elements 2 for generating energy that is used for ejecting a liquid (for instance ink), the elements being lined up in two rows at a predetermined pitch. On the substrate 1 there is opened a liquid feeding port 3 formed through anisotropic etching of Si, between the two rows of energy generating elements 2.

Ejection ports 7 provided at positions opposing respective energy generating elements are formed, by a nozzle forming member 6, at the top of substrate 1. The nozzle forming member 6 also functions as a flow channel forming member for forming individual liquid flow channels 8 communicating from the liquid feeding port 3 to respective ejection ports 7. The positions of the ejection ports are not limited to positions facing the energy generating elements.

The liquid ejection head is disposed so that the surface on which the ejection ports 7 are formed faces a recording surface of a recording medium. The energy generated by the energy generating elements 2 is utilized by the ink that fills the flow channel through the liquid feeding port 3. Recording is achieved in that ink droplets are ejected from the ejection ports 7, by virtue of this energy, and are caused to adhere to the recording medium. Examples of the energy generating elements include, although not limited thereto, electro-thermal conversion elements (so-called heaters) that generate thermal energy, and piezoelectric elements that generate mechanical energy.

An example of a method for producing a liquid ejection head, which is one form of the present disclosure, will be described next with reference to FIGS. 3A to 3F. FIGS. 3A to 3F are a set of schematic cross-sectional view diagrams illustrating an example of a method for producing a liquid ejection head (inkjet head) according to the present disclosure, in the sequence of the steps of the method. FIGS. 3A to 3F illustrate a cross-sectional structure viewed from a plane perpendicular to the substrate, in a completed state, similarly to FIG. 2.

Figure 3A:
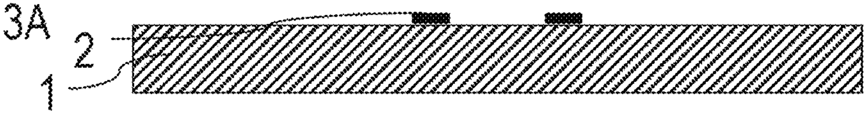
FIGS. 3A to 3F are a set of schematic cross-sectional diagrams illustrating a production process of a liquid ejection head according to an embodiment of the present disclosure.

Firstly, a substrate 1 is prepared such that the energy generating elements 2 are provided on the surface of the substrate 1, as illustrated in FIG. 3A. Various shapes and materials can be adopted in the substrate, without particular limitations, so long as the substrate can function as part of a member constituting the below-described liquid flow channels 8, and can also function as a support for the nozzle forming member 6 that forms a substrate protective layer 4 and the ejection ports 7 described below. In the present embodiment a silicon substrate is used for the purpose of forming, by anisotropic etching described further on, the liquid feeding port 3 that runs the substrate.

A desired number of for instance electro-thermal conversion elements or piezoelectric elements is disposed on the substrate 1, as the energy generating elements 2. Recording is accomplished in that energy for ejecting ink droplets is imparted to a liquid (for instance ink) by such energy generating elements 2. In a case for instance where electro-thermal conversion elements are used as the energy generating elements 2, the elements heat up ink in the vicinity, to elicit as a result a change in the state of the ink, and generate ejection energy. When for instance piezoelectric elements are used, ejection energy is generated as a result of mechanical vibration of the elements. A control signal input electrode (not shown) for operating the energy generating elements is connected to these elements.

A protective layer (not shown) may be further provided for the purpose of improving the durability of these energy generating elements 2.

Figure 3B:
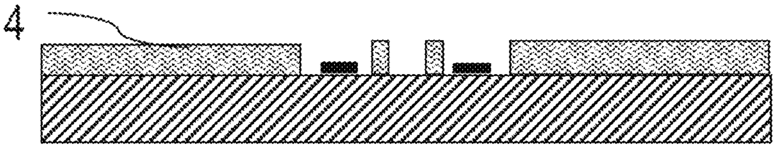

As illustrated in FIG. 3B, the substrate protective layer 4 comprising an ion scavenger, which is a characterizing feature of the present disclosure, is further provided next, for the purpose of improving adhesiveness between the substrate and the nozzle forming member, and preventing corrosion of electro-thermal conversion bodies. The substrate protective layer 4 is obtained through formation of a resin layer in accordance with a general-purpose solvent coating method such as spin coating or slit coating, followed by formation of a desired pattern by plasma ashing, using a mask resist.

The ion scavenger may be incorporated into an adhesion layer for improving adhesiveness between the substrate and the nozzle forming member, and yield thereby the substrate protective layer; alternatively, the adhesion layer may be provided between the substrate and the substrate protective layer comprising an ion scavenger. Alternatively, the adhesion layer may be further provided on the substrate protective layer that comprises the ion scavenger provided on the substrate. In a case where the influence of an ionic substance contained in the adhesion layer needs to be factored in, preferably an ion scavenger is incorporated into the adhesion layer, to thereby form the substrate protective layer; alternatively, the adhesion layer is further provided on the substrate protective layer that comprises an ion scavenger and that is provided on the substrate.

An explanation follows next on the ion scavenger comprised in the substrate protective layer. The ion scavenger is not particularly limited, so long as it can trap and inactivate ionic impurities present in the system. Depending on the target of such trapping, ion scavengers are roughly classified into cation scavengers that trap cations, anion scavengers that trap anions, and amphoteric ion scavengers that trap both cations and anions.

The ion scavenger may be selected in the form of an appropriate scavenger for the ion that is to be removed, but preferably the ion scavenger is at least one ion scavenger selected from the group consisting of an anion scavenger and an amphoteric ion scavenger. Particularly preferably, the ion scavenger is an amphoteric ion scavenger, for the purpose of coping with ever more diverse ink types. Ion scavengers include ion scavengers made up of an organic compound, and ion scavengers made up of an inorganic compound; from the viewpoint of heat resistance, however, the ion scavenger herein preferably consists of an inorganic compound.

The boiling point at normal pressure of the ion scavenger is preferably 200° C. or higher. By virtue of the fact that the ion scavenger has a boiling point at normal pressure of 200° C. or higher, an effect is elicited in that the ion scavenging ability of the ion scavenger is not readily lost, even after the ion scavenger has undergone the below-described curing step at about 200° C. The boiling point of the ion scavenger is preferably 250° C. or higher, and more preferably 300° C. or higher, at normal pressure. The upper limit of the boiling point of the ion scavenger at normal pressure is not particularly restricted, but is ordinarily 6000° C.

The volume-average particle diameter of the ion scavenger is preferably 1.5 μm or less, preferably 1.0 μm or less, and preferably 0.5 μm or less. The lower limit of the volume-average particle diameter of the ion scavenger is not particularly restricted, but is ordinarily 0.01 μm, and may be 0.1 μm. An effect of improving the film forming property of the substrate protective layer is brought out when the volume-average particle diameter of the ion scavenger lies in this range. A known method can be used as appropriate as the method for measuring the volume-average particle diameter of the ion scavenger; also, values in the catalog of the manufacturer of the ion scavenger can be utilized.

Examples of ion scavengers made up of organic compounds include porphyrins and derivatives thereof, as well as cyclic amides. Examples of ion scavengers made up of inorganic compounds include inorganic particles containing at least one selected from the group consisting of Zr, Sb, Bi, Mg, Al, Ca, Ti and Sn. Further examples include for instance binary inorganic fine particles such as Al/Mg inorganic particles and ternary inorganic fine particles such as Al/Mg/Zr inorganic particles. Preferred among the foregoing are inorganic fine particles containing Zr, Sb or Bi, binary inorganic fine particles containing Sb and Bi, Mg and Al, or Zr and Bi, and ternary inorganic fine particles containing Zr, Mg and Bi. Examples thereof include IXEPLAS-A1 and IXEPLAS-A2 (by Toagosei Co., Ltd.).

From the viewpoint of ion scavenging ability and film forming properties, the content of the ion scavenger is preferably 0.05 parts by mass or more, more preferably 0.5 parts by mass or more, and yet more preferably 1 part by mass or more, relative to 100 parts by mass of the resin contained in the substrate protective layer. The content of the ion scavenger is preferably 10 parts by mass or less, more preferably 5 parts by mass or less, yet more preferably 3 parts by mass or less, and particularly preferably 2 parts by mass or less. Further, an additive such as a dispersing agent may be further added, in order to improve the dispersibility of the ion scavenger in a resin.

The substrate protective layer preferably comprises a resin, and more preferably comprises at least one resin selected from the group consisting of an epoxy resin, a polyimide resin and a polyether amide resin. Examples of epoxy resins include EHPE3150 (by Daicel Corporation). Examples of polyimide resins include Photoneece (by Toray Industries, Inc.), and examples of polyether amide resins include HIMAL1200 (by Showa Denko Materials Co., Ltd.).

In a case where the substrate protective layer comprises an epoxy resin, the epoxy equivalent is preferably 2000 or less, and more preferably 1000 or less, from the viewpoint of the dispersibility of the ion scavenger in the epoxy resin. The epoxy equivalent is preferably 200 or more, and is more preferably 250. Preferably, the epoxy resin has a propylene oxide skeleton since in that case adhesiveness of the substrate protective layer to the substrate is enhanced. Examples of epoxy resins that satisfy these requirements include propylene oxide-modified epoxy resins, for instance EP-4000S (by ADEKA Corporation) and GT-401 (by Daicel Corporation). The above substrate protective layer may form below-described liquid flow channels.

Figure 3C:
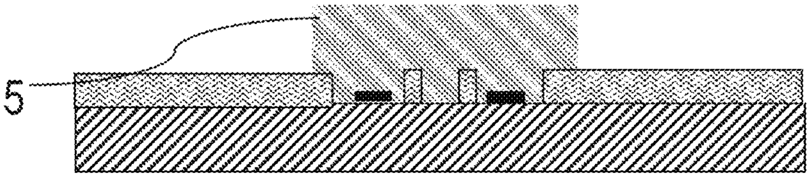

Next, as illustrated in FIG. 3C, a pattern 5 that yields the shape of liquid flow channels and is made up of a positive-type photosensitive resin is formed on the substrate 1 including the energy generating elements 2. Examples of the positive-type photosensitive resin in the present disclosure include a deep UV patternable polymethyl isopropenyl ketone resin, polymethyl methacrylate resins, and other vinylketone-based resins. This liquid flow channel pattern can be formed by forming a layer of the positive-type photosensitive resin in accordance with a general-purpose solvent coating method such as spin coating or slit coating, followed by patterning of the layer of the positive-type photosensitive resin in a photolithographic process using a photomask.

Figure 3D:
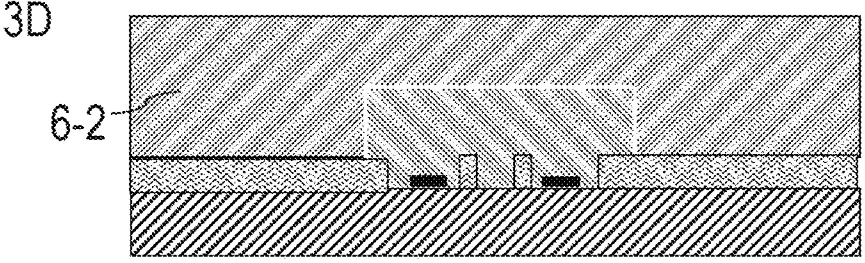

As illustrated in FIG. 3D, a negative-type photosensitive resin layer 6-2 that yields the nozzle forming member 6 is next formed by spin coating, roll coating, slit coat or the like on the substrate 1 having formed thereon the pattern 5 that yields the shape of the liquid flow channels. This negative-type photosensitive resin is required to exhibit high mechanical strength as a structural material, adhesiveness to the underlying base, ink resistance, and at the same time, also resolution for patterning of the fine pattern of the ink ejection ports. The material involved is not particularly limited so long as it satisfies these characteristics, but a cationically polymerized epoxy resin can be suitably used.

A negative-type photocationically polymerized epoxy resin is preferably used as the cationically polymerized epoxy resin. For instance, a reaction product, of bisphenol A and epichlorohydrin, having a molecular weight of about 900 or more, and a reaction product of bromobisphenol A and epichlorohydrin can be used herein. A reaction product of a phenol novolac or o-cresol novolac and epichlorohydrin can likewise be used. The epoxy resin is however not limited to these compounds. The epoxy equivalent (units: g/eq) of the above above-described epoxy resin is preferably 2000 or less, and more preferably 1000 or less. A sufficient crosslink density is obtained during the curing reaction, and adhesiveness and ink resistance are excellent, in a case where the epoxy equivalent is 2000 or less. The lower limit of the epoxy equivalent is not particularly restricted, but is preferably 30 or more, and more preferably 50 or more.

A compound that generates an acid when irradiated with light can be used as the photocationic polymerization initiator for curing the epoxy resin. Such a polymerization initiator is not particularly limited, and for instance an aromatic sulfonium salt or an aromatic iodonium salt can be used. Examples of aromatic sulfonium salts include TPS-102, 103 and 105, MDS-103, 105, 205 and 305, and DTS-102 and 103 (by Midori Chemical Co., Ltd.), as well as SP-170 and 172 (by ADEKA Corporation).

As an aromatic iodonium salt there can be preferably used for instance DPI-105, MPI-103 or 105, or BBI-102, 103 or 105 (by Midori Chemical Co., Ltd.). The addition amount of the photocationic polymerization initiator can be arbitrarily set so as to achieve the targeted sensitivity; in particular, the addition amount is preferably from 0.5 parts by mass to 5.0 parts by mass relative to 100 parts by mass of epoxy resin. For instance SP-100 (by ADEKA Corporation) may be further incorporated as a wavelength sensitizer, as needed.

The negative-type photosensitive resin can appropriately contain additives or the like, as the case may require. Examples of additives include flexibility-imparting agents aimed at lowering the elastic modulus of the negative-type photosensitive resin, and silane coupling agents for enhancing adhesion to the underlying base.

Figure 3E:
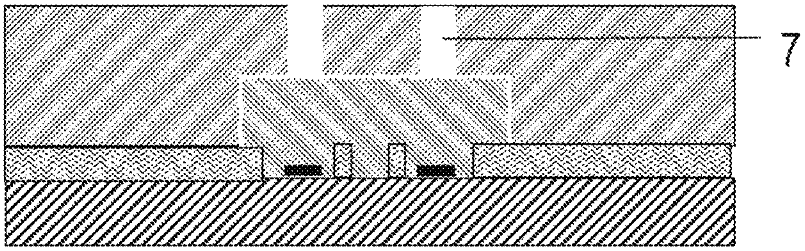

The ejection ports 7 are formed next, as illustrated in FIG. 3E. The ejection ports 7 can be formed by exposing the pattern via a photomask, followed by developing.

Figure 3F:
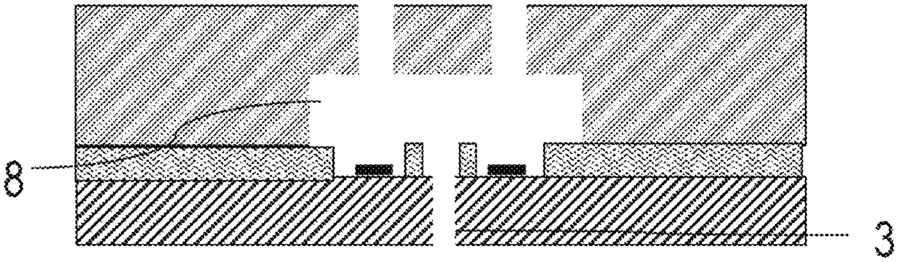

Next, as illustrated in FIG. 3F, the ink feeding port 3 that runs through the substrate 1 is formed, and the pattern 5 that yields the shape of the ink flow channels is removed, to form as a result the liquid flow channels 8. A heating treatment is further performed as needed, a member (not shown) for liquid supply is joined, and electric joining (not shown) for driving the energy generating elements 2 is performed, to thereby complete the liquid ejection head.

By relying on the method for producing a liquid ejection head described above it becomes possible to suppress corrosion of the electro-thermal conversion bodies, and to provide a liquid ejection head of high electrical reliability also with ever more diverse ink types.

EXAMPLES

The present disclosure will be explained in detail hereafter on the basis of examples and comparative examples; however, the present disclosure is not meant to be limited to the features implemented in these examples. Unless otherwise specified, the language "parts" as used in the examples and comparative examples denotes "parts by mass".

HAST Test and Evaluation of Film Formation Properties

Examples and Comparative Examples

Each material given in Table 1 was respectively applied onto two copper wires (line width 20 μm, film thickness 0.15 μm, length 100 line spacing 20 μm) printed on a glass plate, to a thickness of 5 with curing at 250° C. for 60 minutes. A photocurable epoxy resin resist having a hydrolyzable chlorine concentration adjusted to 500 ppm was then applied onto the layer of the material, and was then cured by exposure, at an exposure dose of 5000 J/m$^2$ using an i-line stepper FPA-3000i5+, by Canon Inc. A respective test piece was prepared thereafter by completely curing the photocurable epoxy resin resist at 200° C. for 60 minutes.

Next, a HAST test was performed on a given number of the above test pieces, under conditions of 130° C., 85% RH, applied voltage of 40 V, and 100 hours; the ratio of the test pieces in which a wire broke or a short circuit occurred was taken as a defect rate. The film forming property of each test piece was concurrently evaluated according to the following criteria. A film thickness distribution can be measured for instance by carrying out an in-plane 100-point measurement using a contact-less film thickness measuring apparatus such as Lambda Ace (by SCREEN Holdings, Co., Ltd.). The results are given in Table 1.

Evaluation of a Film Forming Property

A: Film thickness distribution of 2% or lower

B: Film thickness distribution exceeding 2%, up to less than 5%

C: Film thickness distribution exceeding 5%

The results given in Table 1 will be explained next.

TABLE 1

| | | Ion scavenger | | | | | Film |
|---|---|---|---|---|---|---|---|
| | Resin | Ion scavenging ability | Inorganic/ organic | Parts by mass | Particle diameter | Defect rate | forming property |
| Example 1 | Polyether amide | Amphoteric ion | Inorganic | 2 parts | 0.2 μm | 0% | A |
| Example 2 | Polyimide | Amphoteric ion | Inorganic | 2 parts | 0.2 μm | 0% | A |
| Example 3 | Polyether amide | Anion | Inorganic | 2 parts | 0.2 μm | 0% | A |
| Example 4 | Polyether amide | Amphoteric ion | Inorganic | 0.1 parts | 0.2 μm | 20% | A |
| Example 5 | Polyether amide | Amphoteric ion | Inorganic | 2 parts | 1.5 μm | 0% | B |
| Comparative example 1 | Polyether amide | — | — | — | — | 100% | A |

In Examples 1 to 3, the defect rate was 0% if an anion scavenger or an amphoteric ion scavenger was used, regardless of the type of resin. In Example 4 it was found that the defect rate was 20%, and a certain defect rate reduction effect could be achieved, also when the content of amphoteric scavenger was 0.1 parts by mass relative to 100 parts by mass of resin. Example 5 revealed that a given film forming property can be obtained even if the particle diameter of the ion scavenger is large. In Comparative example 1 the defect rate was high, since no ion scavenger was used.

As another comparative example, a test piece was produced and evaluated in accordance with the same methods as above, but herein a cation scavenger made up of an inorganic compound was used as the ion scavenger; it was found that the defect rate in the present embodiment was high. Similarly, it was found that when using an amphoteric ion scavenger made up of an organic compound the defect rate was high, possibly because the ion scavenger disappeared due to heating during the preparation of the test piece. It is deemed that in such a case an appropriate ion scavenger may be suitably selected in accordance with the heating temperature and the type of ions present in the environment.

Inkjet Head Evaluation

Example 6

The inkjet head illustrated in FIG. 2 was produced in accordance with the method explained with reference to FIGS. 3A to 3F. Firstly there were prepared electro-thermal conversion elements (heaters made up of an $HfB_2$ material) as the energy generating elements 2, and a silicon substrate 1 having a SiN+Ta multilayer film (not shown) at a liquid flow channel forming portion.

The substrate was coated, by spin coating, with a resin composition resulting from incorporating 2 parts by mass of IXEPLAS-A2 (by Toagosei Co., Ltd.) as an ion scavenger, into HIMAL-1200 (by Showa Denko Materials Co., Ltd.) used as the substrate protective layer. This was followed by baking for 1 hour at 250° C., and then a mask resist was produced using OFPR-800 (by Tokyo Ohka Kogyo Co., Ltd.), whereupon a pattern of the substrate protective layer 4 was produced by pattern exposure at an exposure dose of 8000 $J/m^2$, using an i-line stepper FPA-3000i5+ by Canon Inc., and by $O_2$ ashing. The thickness of this layer was 2 μm (FIG. 3B).

Then ODUR-1010 (by Tokyo Ohka Kogyo Co., Ltd.) was applied by spin coating, followed by baking at 120° C. for 6 minutes. Pattern exposure was then carried out at an exposure dose of 15000 $mJ/cm^2$ using a deep UV exposure apparatus UX-3300 by Ushio, Inc., via a photomask. This was followed by development with methyl isobutyl ketone, to produce the pattern 5 that yielded the shape of the liquid flow channels. The thickness of this layer was 20 μm (FIG. 3C).

A negative-type photosensitive resin resulting from dissolving EHPE3150 (by Daicel Corporation) as an epoxy resin and SP170 (by ADEKA Corporation) as a photopolymerization initiator in xylene was applied next by spin coating. Thereafter, baking was performed at 90° C. for 5 minutes, to form a layer 6 of the negative-type photosensitive resin. The thickness of the negative-type photosensitive resin layer 11 was 40 μm on the substrate, and 20 μm on a pattern 6*a* (FIG. 3D).

Pattern exposure was performed next at an exposure dose of 5000 $J/m^2$ using an i-line stepper FPA-3000i5+ by Canon Inc., via a photomask. The ejection ports 7 were formed thereafter through development using methyl isobutyl ketone. As a result of the above processing the cured layer 6-2 of the negative-type photosensitive resin yielded a nozzle forming member 6 (FIG. 3E).

Next, an etching mask (not shown) was formed on the back surface of the substrate to be processed, and the silicon substrate was subjected to anisotropic etching, to thereby form the liquid feeding port 3. Whole-surface exposure was thereafter carried out at an exposure dose of 25000 $mJ/cm^2$ through the nozzle forming member, using a deep UV exposure apparatus UX-3300 by Ushio, Inc., to thereby solubilize the pattern 5 that gave rise to the liquid flow channels that yielded the shape of the liquid flow channels. Subsequently, the pattern 5 that yields the shape of the liquid flow channels was dissolved off, by being immersed in methyl lactate while under application of ultrasounds, to thereby form the liquid flow channels 8 (FIG. 3F).

In order to completely cure the nozzle forming member 6, a heating treatment was performed at 200° C. for 1 hour, a member (not shown) for liquid supply was joined, and electric joining (not shown) for driving the energy generating elements 2 was performed, to thereby complete the inkjet head.

The inkjet head obtained above was set in a printer, and an ejection durability test was carried out using ink of pure water/diethylene glycol/isopropyl alcohol/lithium acetate/black dye Food Black 2=79.4/15/3/0.1/2.5 (mass ratio). The results are given in Table 2. The ejection durability test involves continuous output of 15,000 prints, with evaluation of ink landing accuracy before and after the durability test, and evaluation of the presence or absence of peeling of the nozzle forming member and/or the substrate protective layer, from the substrate, in the inkjet head after the durability test. Ink landing accuracy and the HAST test were evaluated according to the criteria below. All evaluations are visual measurements and observations performed using a metallurgical microscope.

Evaluation of Ink Landing Accuracy

A: Deviation of ink landing, between before and after the durability test, within B: Deviation of ink landing, between before and after the durability test, in excess of 5 μm, but within 10 μm C: Deviation of ink landing, between before and after the durability test, in excess of 10 μm HAST Test The obtained inkjet head was subjected to a HAST test under conditions of 60° C., 90% RH, applied voltage of 40 V, and 100 hours, and the results were evaluated according to the criteria below.

A: No short circuit

B: Short circuit

The above results are summarized in Table 2.

TABLE 2

| | Ink landing accuracy | HAST rating |
|---|---|---|
| Example 6 | A | A |

Table 2 reveals that the inkjet head produced according to Example 6 of the present disclosure exhibited good ink ejection accuracy and high electrical reliability.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-170251, filed Oct. 18, 2021 which is hereby incorporated by reference herein in its entirety.

What is claimed is:

1. A liquid ejection head, comprising:

a substrate having a liquid feeding port and an energy generating element;

a substrate protective layer provided on the substrate; and a nozzle forming member provided on the substrate protective layer, and having an ejection port for ejecting a liquid, and a liquid flow channel in communication with the liquid feeding port and the ejection port;

wherein the substrate protective layer comprises an ion scavenger, and wherein the liquid flow channel is formed by the substrate protective layer and the nozzle forming member.

2. The liquid ejection head according to claim 1, wherein the ion scavenger is at least one scavenger selected from the group consisting of an anion scavenger and an amphoteric ion scavenger.

3. The liquid ejection head according to claim 1, wherein the ion scavenger consists of an inorganic compound.

4. The liquid ejection head according to claim 1, wherein the ion scavenger has a volume-average particle diameter of 1.0 μm or less.

5. The liquid ejection head according to claim 1, wherein the substrate protective layer comprises a resin; and the content of the ion scavenger is 0.05 to 2 parts by mass relative to 100 parts by mass of the resin.

6. The liquid ejection head according to claim 1, wherein the substrate protective layer comprises a resin; and the resin comprises at least one resin selected from the group consisting of an epoxy resin, a polyimide resin, and a polyether amide resin.

7. The liquid ejection head according to claim 6, wherein the substrate protective layer comprises at least one resin selected from the group consisting of a polyimide resin and a polyether amide resin.

8. The liquid ejection head according to claim 6, wherein the substrate protective layer comprises an epoxy resin having a propylene oxide skeleton.

9. A method for producing a liquid ejection head comprising:

a substrate having a liquid feeding port and an energy generating element;

a substrate protective layer provided on the substrate; and a nozzle forming member provided on the substrate protective layer, and having an ejection port for ejecting a liquid, and a liquid flow channel in communication with the liquid feeding port and the ejection port, the method comprising the steps of:

patterning a resin on the substrate, to form the substrate protective layer; and patterning a negative-type photosensitive resin, on the substrate protective layer, to form a nozzle forming member having an ejection port for ejecting a liquid, and a liquid flow channel in communication with the liquid feeding port and the ejection port, wherein the substrate protective layer comprises an ion scavenger, and wherein the liquid flow channel is formed by the substrate protective layer and the nozzle forming member.

10. The method for producing a liquid ejection head according to claim 9, wherein the ion scavenger is at least one scavenger selected from the group consisting of an anion scavenger and an amphoteric ion scavenger.

11. The method for producing a liquid ejection head according to claim 9, wherein the ion scavenger consists of an inorganic compound.

12. The method for producing a liquid ejection head according to claim 9, wherein the ion scavenger has a volume-average particle diameter of 1.0 μm or less.

13. The method for producing a liquid ejection head according to claim 9, wherein the substrate protective layer comprises a resin; and the content of the ion scavenger is 0.05 to 2 parts by mass relative to 100 parts by mass of the resin.

14. The method for producing a liquid ejection head according to claim 9, wherein the substrate protective layer comprises a resin; and the resin comprises at least one resin selected from the group consisting of an epoxy resin, a polyimide resin and a polyether amide resin.

15. The method for producing a liquid ejection head according to claim 14, wherein the substrate protective layer comprises at least one resin selected from the group consisting of a polyimide resin and a polyether amide resin.

16. The method for producing a liquid ejection head according to claim 14, wherein the substrate protective layer comprises an epoxy resin having a propylene oxide skeleton.

17. The liquid ejection head according to claim 1, wherein the ion scavenger consists of an inorganic compound selected from the group consisting of an anion scavenger and an amphoteric ion scavenger.

18. The liquid ejection head according to claim 17, wherein the substrate protective layer comprises a resin;

wherein the content of the ion scavenger is 0.05 to 2 parts by mass relative to 100 parts by mass of the resin, and wherein the resin comprises at least one resin selected from the group consisting of an epoxy resin, a polyimide resin, and a polyether amide resin.

19. The liquid ejection head according to claim 17, wherein the inorganic compound includes inorganic particles containing at least one selected from the group consisting of Zr, Sb, Bi, Mg, Al, Ca, Ti and Sn.

* * * * *